(12) United States Patent
Nakata et al.

(10) Patent No.: US 9,324,581 B2
(45) Date of Patent: Apr. 26, 2016

(54) METHOD FOR MANUFACTURING SEMICONDUCTOR DEVICE

(71) Applicants: Kazunari Nakata, Tokyo (JP); Yoshiaki Terasaki, Tokyo (JP)

(72) Inventors: Kazunari Nakata, Tokyo (JP); Yoshiaki Terasaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 13/739,946

(22) Filed: Jan. 11, 2013

(65) Prior Publication Data
US 2013/0267065 A1  Oct. 10, 2013

(30) Foreign Application Priority Data

Apr. 9, 2012  (JP) ................................. 2012-088437

(51) Int. Cl.
| | | |
|---|---|---|
| *H01L 21/50* | (2006.01) | |
| *H01L 21/67* | (2006.01) | |
| *H01L 21/683* | (2006.01) | |

(52) U.S. Cl.
CPC .......... *H01L 21/50* (2013.01); *H01L 21/67115* (2013.01); *H01L 21/67132* (2013.01); *H01L 21/6836* (2013.01); *H01L 2221/6834* (2013.01); *H01L 2221/68327* (2013.01)

(58) Field of Classification Search
None
See application file for complete search history.

(56) References Cited

U.S. PATENT DOCUMENTS

| 4,283,242 A | * | 8/1981 | Regler et al. ................... 156/154 |
|---|---|---|---|
| 5,445,692 A | * | 8/1995 | Nitta ................................. 156/87 |
| 2003/0054643 A1 | * | 3/2003 | Aihara et al. ................. 438/689 |
| 2005/0250295 A1 | * | 11/2005 | Mita .............................. 438/460 |
| 2007/0007247 A1 | | 1/2007 | Sekiya |
| 2007/0249146 A1 | * | 10/2007 | Masuda ........................ 438/464 |
| 2008/0011403 A1 | | 1/2008 | Saito et al. |
| 2008/0038903 A1 | * | 2/2008 | Yamamoto .................... 438/464 |
| 2009/0057841 A1 | * | 3/2009 | Sekiya .......................... 257/619 |
| 2010/0000654 A1 | * | 1/2010 | Kondo ............................. 156/60 |
| 2012/0070658 A1 | * | 3/2012 | Ikishima et al. .............. 428/354 |
| 2013/0203241 A1 | * | 8/2013 | Nakata et al. ................. 438/464 |
| 2013/0210215 A1 | * | 8/2013 | Xue et al. ...................... 438/462 |

FOREIGN PATENT DOCUMENTS

| CN | 1144396 A | 3/1997 |
|---|---|---|
| EP | 0749154 A2 | 12/1996 |

(Continued)

OTHER PUBLICATIONS

An Office Action issued by the Korean Patent Office on Jan. 16, 2014, which corresponds to Korean Patent Application No. 10-2013-0030099 and is related to U.S. Appl. No. 13/739,946; with partial English translasion.

(Continued)

*Primary Examiner* — Charles Garber
*Assistant Examiner* — Stanetta Issac
(74) *Attorney, Agent, or Firm* — Studebaker & Brackett PC

(57) ABSTRACT

A wafer is mounted to a dicing frame using a holding tape. A plurality of semiconductor devices are provided on a center portion of a major surface of the wafer. A ring-like reinforcing section is provided on a periphery of the major surface. The holding tape is adhered to the major surface The holding tape is heated to at least 0.6 times of melting temperature of the holding tape so as to adhere the holding tape along a step of the ring-like reinforcing section.

11 Claims, 6 Drawing Sheets

(56) References Cited

FOREIGN PATENT DOCUMENTS

| EP | 2610901 A1 | 7/2013 |
|---|---|---|
| EP | 2610902 A1 | 7/2013 |
| JP | 02-054564 A | 2/1990 |
| JP | 2004-022784 A | 1/2004 |
| JP | 2005-093987 A | 4/2005 |
| JP | 2005-317570 A | 11/2005 |
| JP | 2007-019379 A | 1/2007 |
| JP | 2007-073767 A | 3/2007 |
| JP | 2007-258437 A | 10/2007 |
| JP | 2008-042016 A | 2/2008 |
| JP | 2008-085148 A | 4/2008 |
| JP | 2010-118584 A | 5/2010 |
| JP | 2010-272881 A | 12/2010 |
| JP | 2012-049318 A | 3/2012 |
| KR | 10-2010-0117859 A | 11/2010 |
| WO | 2012/026275 A1 | 3/2012 |

OTHER PUBLICATIONS

An Office Action issued by the Korean Patent Office on Aug. 26, 2014, which corresponds to Korean Patent Application No. 10-2013-0030099 and is related to U.S. Appl. No. 13/739,946; with partial English language translation.

The second Office Action issued by the Chinese Patent Office on May 19, 2015, which corresponds to Chinese Patent Application No. 201310119065.3 and is related to U.S. Appl. No. 13/739,946; with partial English language translation.

An Office Action; "Notice of Reasons for Rejection," issued by the Japanese Patent Office on Jul. 14, 2015, which corresponds to Japanese Patent Application No. 2012-088437 and is related to U.S. Appl. No. 13/739,946; with English language partial translation.

An Office Action issued by the Chinese Patent Office on Oct. 29, 2014, which corresponds to Chinese Patent Application No. 201310119065.3 and is related to U.S. Appl. No. 13/739,946; with partial English language translation.

\* cited by examiner

METHOD FOR MANUFACTURING SEMICONDUCTOR DEVICE

BACKGROUND OF THE INVENTION

1. Field of the Invention

The present invention relates to a method for mounting a wafer, wherein a plurality of semiconductor devices are provided on the center portion of the major surface, and a wafer, wherein a ring-like reinforcing section is provided, is mounted on the periphery of the major surface with a holding tape. In particular, the present invention relates to a method for manufacturing a semiconductor device wherein a holding tape can be adhered to the steps of the ring-like reinforcing section without air bubbles.

2. Background Art

In LSI, the densification of packages by three-dimensional mounting or the like is performed, and wafer thinning to approximately 10 μm when the process is completed has been carried out.

In addition, power devises such as IGBT (Insulated Gate-type Bipolar Transistor), or MOSFET (MOS-type Field Effect Transistors) have been broadly used as semiconductor switches in inverter circuits for industry motors, automobile motors, or the like; power supply power sections for high capacitor server; uninterruptible power-supply system or the like. In the fabrication of power devices, for improving power distribution characteristics such as ON characteristics, semiconductor substrate is thinly processed.

In recent years, in order to improve costs and characteristics, semiconductor devices have been fabricated using ultrathin wafers thinned to approximately 50 μm by an FZ (Floating Zone) method.

In general, for thinning wafer, mechanical grinding by back grinding or polishing, and wet etching or dry etching for removing fabricate strains generated by mechanical grinding are performed. Thereafter, a diffused layer is formed on the back surface side using ion implantation or heat treatment, and an electrode is formed using a spattering method or the like.

In such situations, the frequency of wafer cracking in the back face processing is elevated. Therefore, processing methods to make only the center portions thin while remaining the thick outer peripheral as a circularly reinforcing section (lib) have been proposed (for example, refer to Japanese Patent Application Laid-Open No. 2007-19379). By using such wafers having fibs, the warpage of the wafers is substantially reduced, and the transportation of wafers is facilitated. At the same time, the intensity of wafers becomes highly improved, and the breaking or cracking of wafers can be reduced.

When chips are cut to individual pieces, after mounting a wafer in a dicing frame using a holding tape, dicing is performed by blading or using laser. At this time, if the holding sheet is not perfectly adhered, the chips are scattered during dicing, and due to the scattered chips, the production of the semiconductor device becomes difficult.

In order to solve such problems, there has been proposed a method for improving the adherence to the steps by pressing and deforming the holding tape to meet the shape of the lib-having wafer by a precisely adjusted ring-like convex to meet the inner diameter of the circularly reinforcing section (for example, refer to Japanese Patent Application Laid-Open No. 2008-42016). In addition, a method for improving the adherence to the steps by pressing and deforming the holding tape by introducing compressed air has been proposed (for example, refer to Japanese Patent Application Laid-Open No. 2010-118584).

SUMMARY OF THE INVENTION

In the method wherein a holding tape is pushed in according to the inner radius of the rib with the circular convex, there is the problem wherein the wafer is broken when pressed due to the variation of the rib width or the variation of the pressing location, or the problem wherein air bubbles are formed in the holding tape.

In the method wherein the holding tape is compressed by the introduction of compressed air, sufficient pressure cannot be obtained by the compressed air depending upon the stiffness of the holding tape, and there is a problem therein air bubbles generate on the holding tape.

In view of the above-described problems, an object of the present invention is to provide a method for manufacturing a semiconductor device wherein a holding tape can be adhered to the steps of the ring-like reinforcing section without air bubbles.

According to the present invention, a wafer is mounted to a dicing frame using a holding tape. A plurality of semiconductor devices are provided on a center portion of a major surface of the wafer. A ring-like reinforcing section is provided on a periphery of the major surface. The holding tape is adhered to the major surface The holding tape is heated to at least 0.6 times of melting temperature of the holding tape so as to adhere the holding tape along a step of the ring-like reinforcing section.

The present invention makes it possible to adhere holding tape to the steps of the ring-like reinforcing section without air bubbles.

Other and further objects, features and advantages of the invention will appear more fully from the following description.

DETAILED DESCRIPTION OF THE PREFERRED EMBODIMENTS

A method for manufacturing a semiconductor device according to the embodiments of the present invention will be described with reference to the drawings. The same components will be denoted by the same symbols, and the repeated description thereof may be omitted.

First Embodiment

Figure 1:
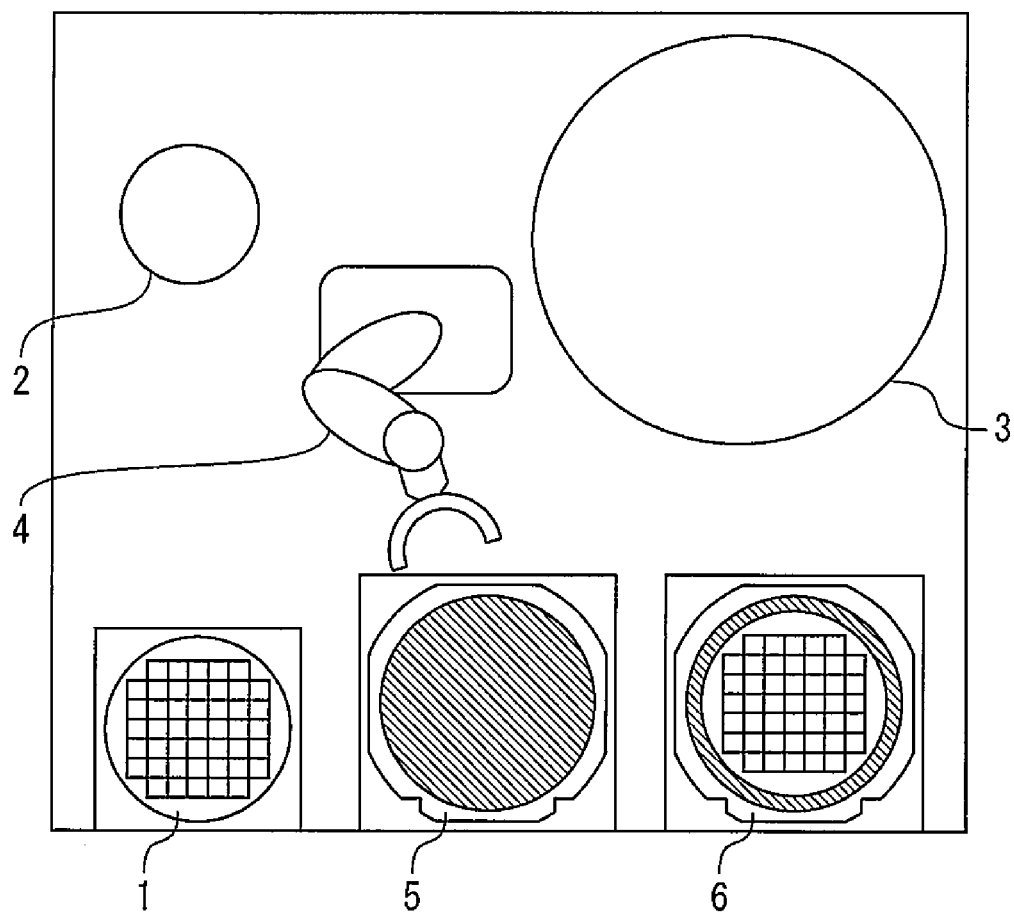
FIG. 1 is a top view showing a mounting device according to the first embodiment of the present invention.

FIG. 1 is a top view showing a mounting device according to the first embodiment of the present invention. The wafer 1 with a rib is transferred to the wafer mounting section 3 with the transporting arm 4 after location adjustment of wafer aligning or the like. After the location of the dicing frame 5 with the holding tape is adjusted at the alignment section 2, the dicing frame 5 is transferred to the wafer mounting section 3 with the transporting arm 4. At the wafer mounting section 3, the wafer 1 is adhered to the dicing frame 5 with the holding tape, and stored in the wafer storing portion 6 with the transporting arm 4.

Figure 2:
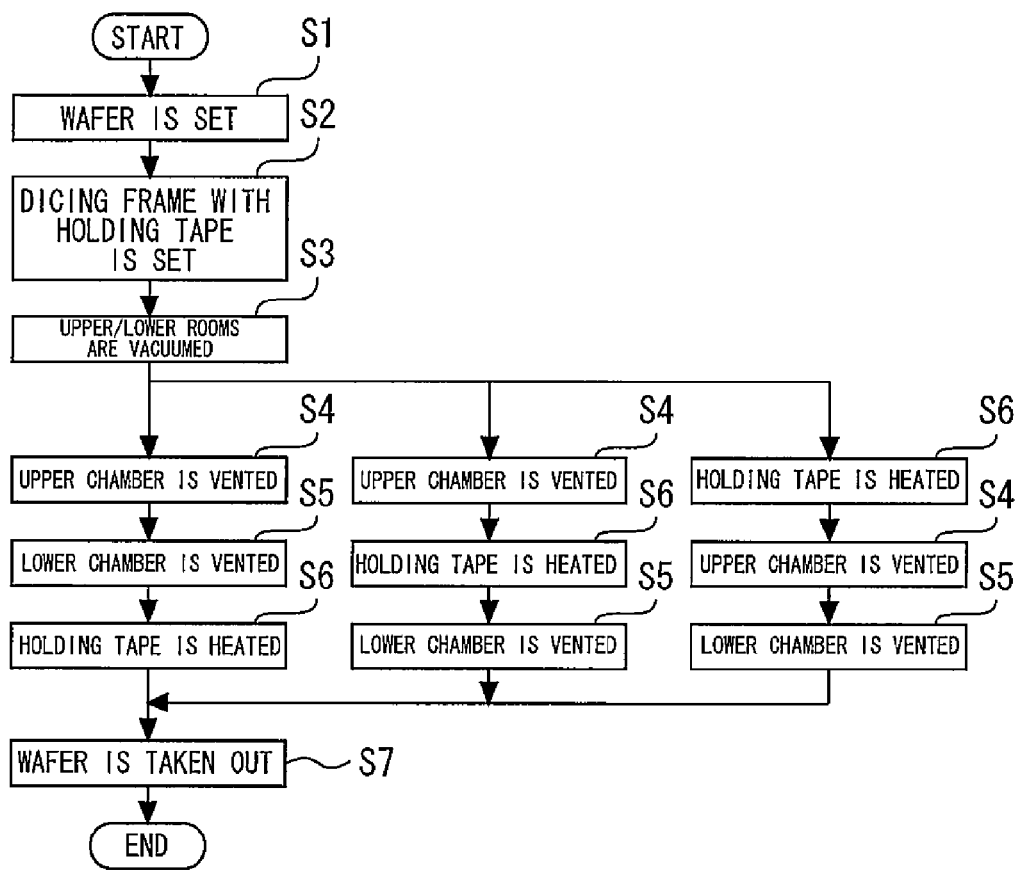
FIG. 2 is a flow chart showing a method for manufacturing a semiconductor device according to the first embodiment of the present invention.

FIG. 2 is a flow chart showing a method for manufacturing a semiconductor device according to the first embodiment of the present invention. FIGS. 3 to 6 are sectional views showing the wafer mounting section 3 according to the first embodiment of the present invention. Referring these drawings, the method for manufacturing the semiconductor device according to the first embodiment of the present invention will be described.

Pluralities of semiconductor devices, such as MOSFET and IGST, are provided in the center portion of the major surface of the wafer 1; a ring-like reinforcing section 7 are provided on the peripheral portion of the major surface; and the diffused layer and the electrode are provided on the backface of the wafer 1. The method in the first embodiment is a method for mounting the wafer 1 with the rib to the dicing frame 9 using the holding tape B.

Figure 3:
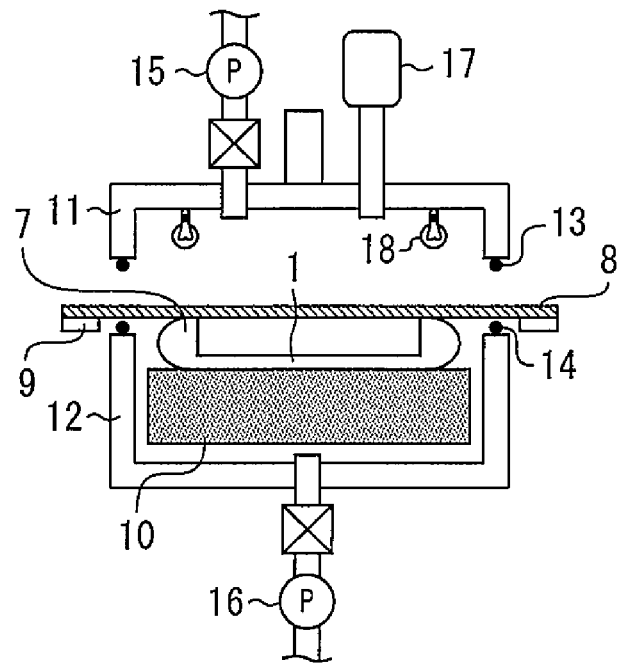
FIGS. 3 to 6 are sectional views showing the wafer mounting section 3 according to the first embodiment of the present invention.

Firstly, as shown in FIG. 3, the wafer 1 is set on the stage 10 with the transporting arm 4 (Step S1). Thereafter, the dicing frame 9 wherein the holding tape 8 is adhered is set on the wafer 1 with the transporting arm 4 (Step S2).

Figure 4:
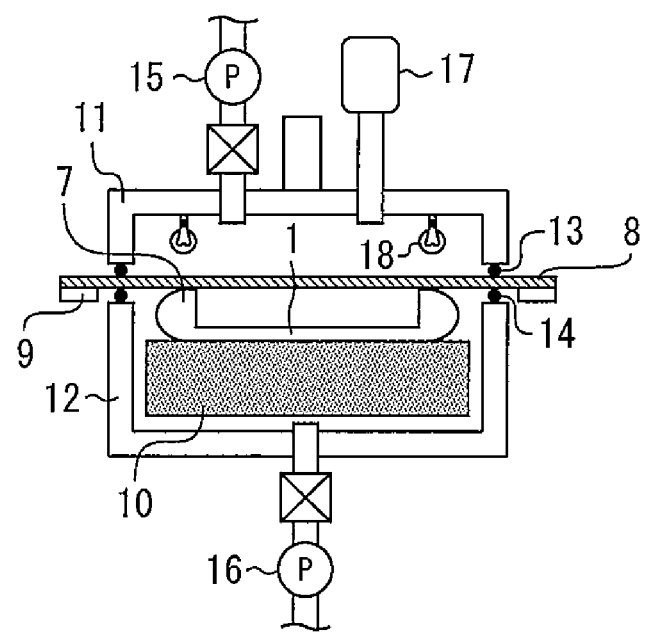

Next, as shown in FIG. 4, the upper chamber 11 descends from the above in the direction of the lower chamber 12, and the O-ring 13 of the upper chamber 11 and the O-ring 14 of the lower chamber 12 pinch the holding tape 8. The upper room is constituted by the upper chamber 11 and the holding tape 8, and the lower room is constituted by the lower chamber 12 and the holding tape 8. Then, each of the upper room and the lower room are vacuumed to 1000 Pa or lower using vacuum pumps 15 and 16, respectively (Step S3).

Figure 5:
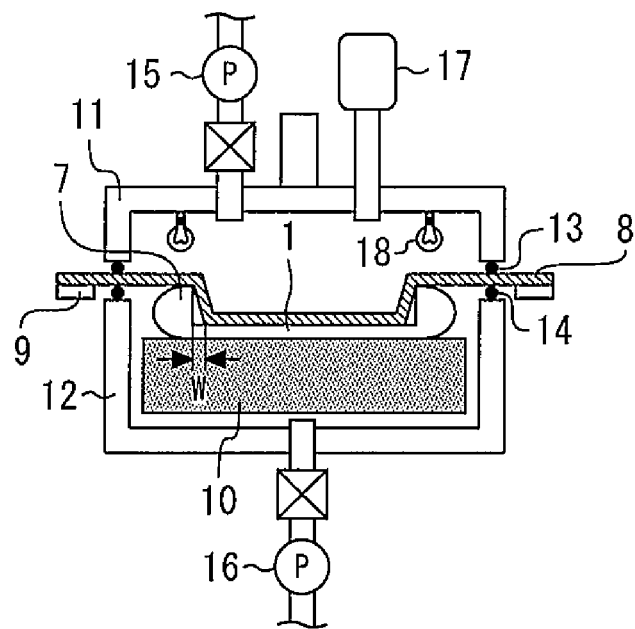
Figure 6:
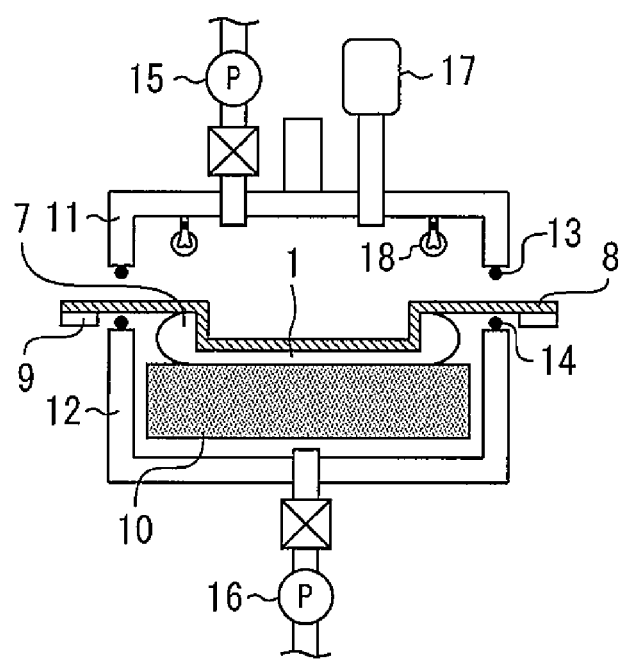

Next, as shown in FIG. 5, the vacuum pump 15 is stopped, the upper chamber 11 is vented with nitrogen gas 17, and the holding tape 8 is adhered to the major surface by the differential pressures between the vacuum of 1000 Pa or lower of the lower chamber and the atmosphere of the upper chamber (Step S4). Thereafter, the lower chamber is purged (Step S5). Then, as shown in FIG. 6, the holding tape 8 is heated with a lamp to 0.6 times or higher of the melting point of the holding tape 8; the holding tape 8 is adhered along the step of the ring-like reinforcing section 7 (Step S6). In addition, as shown in the flow chart in FIG. 2, there are three methods varying the sequence of heating the holding tape 8 or the sequence of venting of Steps S4 to S6.

Next, the wafer 1 is taken out of the transporting arm 4, and stored in the wafer storing portion 6 (Step S7). Furthermore, the circular reinforcing section 7 is removed by the dicing process using the blade or raiser, and then divided to individual semiconductor devices.

Figure 7:
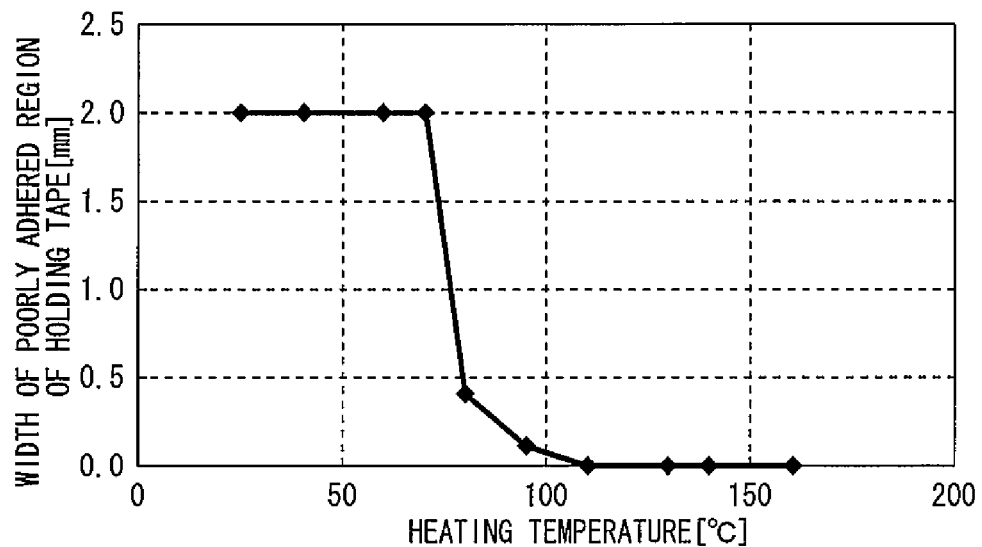
FIG. 7 is a diagram showing the relationship between the width of the poorly adhered region of the holding tape and the heating temperature in the first embodiment of the present invention.

Here, FIG. 7 is a diagram showing the relationship between the width of the poorly adhered region of the holding tape and the heating temperature in the first embodiment of the present invention. The abscissa indicates the measured temperature of the wafer heated by the heating lamp 18. The ordinate indicates the width W of the poorly adhered region after performing the process at the relevant temperature for one minute (refer to FIG. 5). It is known from this data, the width of the poorly adhered region can be substantially reduced.

Figure 8:
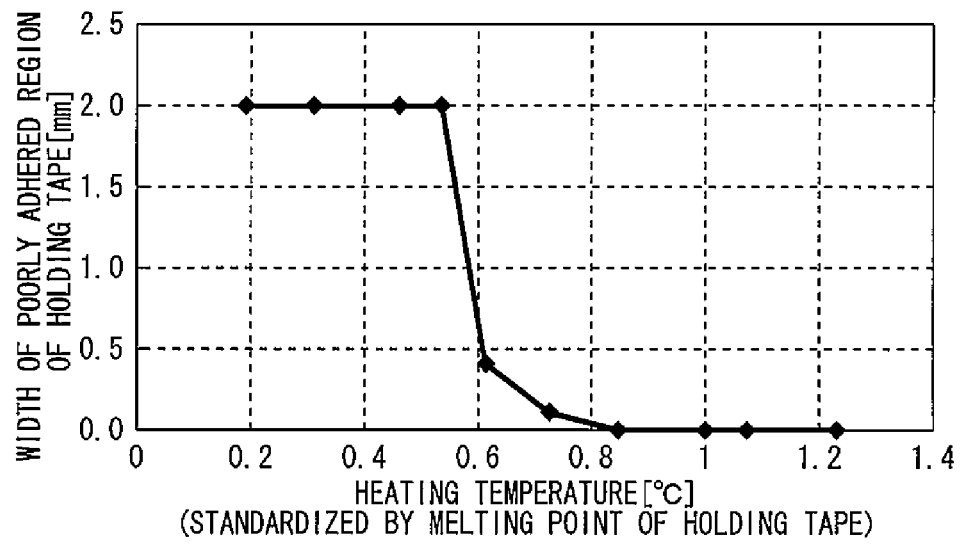
FIG. 8 is a diagram of the heating temperature wherein the heating temperature shown in FIG. 7 is standardized by the melting point of 130° C. of the holding tape that is the melting point of the polypropylene-based holding tape.

FIG. 8 is a diagram of the heating temperature wherein the heating temperature shown in FIG. 7 is standardized by the melting point of 130° C. of the holding tape that is the melting point of the polypropylene-based holding tape. From the data, it is known that the width of the poorly adhered region can be significantly reduced by making the heating temperature to be at least 0.6 times of the melting temperature of the holding tape 8. Although there are three methods wherein the order of steps S4 to S6, in the present evaluation, the difference in the width of the poorly adhered region was not seen.

In the present embodiment, since the holding tape 8 is softened by heating the holding tape 8 to at least 0.6 times of the melting temperature of the holding tape 8, the holding tape 8 can be adhered to the step of the circular reinforcing section 7 without forming air bubbles.

In the embodiment, the holding tape 8 is heated by lamp heating. Lamp heating has the advantage wherein heating can be performed in vacuum.

Also according to the embodiment, the holding tape 8 is adhered on the major surface of the wafer 1 by the differential pressure of the atmosphere and the vacuum of 1000 Pa or below. Due to the pressure difference, the holding tape 8 and the wafer 1 is closely adhered and therefore the adhesion of the holding tape 8 becomes easy.

Second Embodiment

Figure 9:
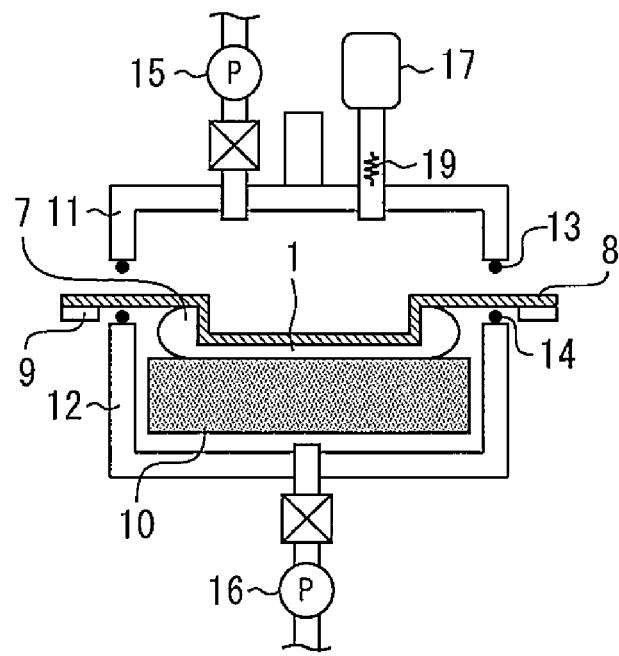
FIG. 9 is a sectional view showing the wafer mounting section according to the second embodiment of the present invention.

FIG. 9 is a sectional view showing the wafer mounting section according to the second embodiment of the present invention. Referring to this diagram, the method for manufacturing the semiconductor device according to the second embodiment of the present invention will be described.

In the same way as in the first embodiment, the process is executed to Step S3. Next, the vacuum pump 15 is stopped, and the upper chamber 11 is vented by nitrogen gas 17 heated to the higher temperature by the heater 19 for heating the nitrogen gas to adhere the holding tape 8 to the major surface of the wafer 1 by the differential pressure between the lower chamber and the upper chamber. At this time, since the holding tape 8 is deformed by the heated nitrogen gas 17, the holding tape 8 is adhered along the step of the circular reinforcing section 7. Thereafter, the lower chamber is purged.

As described above, even if the holding tape 8 is heated using nitrogen gas heated to a higher temperature by the nitrogen gas heater 19, the same effect as the effect of the first embodiment can be obtained.

Third Embodiment

Figure 10:
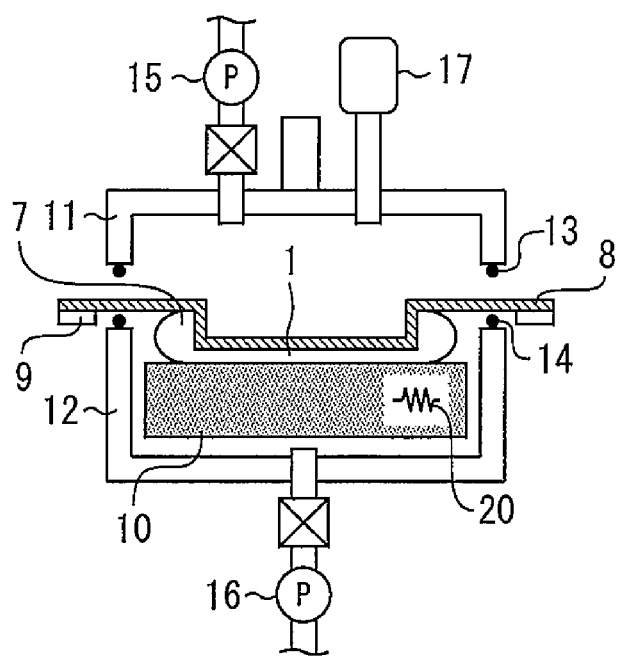
FIG. 10 is a sectional view showing the wafer mounting section according to the first embodiment of the present invention.

FIG. 10 is a sectional view showing the wafer mounting section according to the first embodiment of the present invention. Referring to this diagram, the method for manufacturing the semiconductor device according to the third embodiment of the present invention will be described.

First, in the same way as the first embodiment, steps S1 to S5 are performed. Then, using the heater 20 for heating the stage, the holding tape 8 is heated via the wafer 1, and the holding tape 8 is adhered along the step of the circular reinforcing section 7. Thereafter, the lower chamber is purged.

As described, even if the holding tape 8 is heated using the wafer stage heating heater 20, the same effect as the effect of the first embodiment can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2012-088437, filed on Apr. 9, 2012 including specification, claims, drawings and summary, on which the Convention priority of the present application is based, are incorporated herein by reference in its entirety.

What is claimed is:

1. A method for manufacturing a semiconductor device, wherein a wafer is mounted to a dicing frame using a holding tape, a plurality of semiconductor devices are provided on a center portion of a major surface of the wafer, and a ring-like reinforcing section is provided on a periphery of a rear surface of the wafer, the method comprising:

adhering the holding tape to a center portion of the rear surface of the wafer and a top surface of the ring-like reinforcing section such that a region of the holding tape is poorly adhered to an inside side surface of the ring-like reinforcing section; and heating the holding tape to at least 0.6 times of melting temperature of the holding tape so as to decrease the width of the poorly adhered region of the holding tape to the inside side surface of the ring-like reinforcing section.

2. The method according to claim 1, wherein the holding tape is heated by lamp heating.

3. The method according to claim 2, wherein an electrode is provided on the rear surface of the wafer.

4. The method according to claim 1, wherein the holding tape is adhered on the rear surface by differential pressure across the holding tape of an atmosphere and a vacuum of 1000 Pa or below.

5. The method according to claim 4, wherein the holding tape is heated by lamp heating while the differential pressure is applied to the holding tape.

6. A method for manufacturing a semiconductor device, wherein a wafer is mounted to a dicing frame using a holding tape, a plurality of semiconductor devices are provided on a center portion of a major surface of the wafer, and a ring-like reinforcing section is provided on a periphery of a rear surface of the wafer, the method comprising:

adhering the holding tape to a center portion of the rear surface of the wafer and a top surface of the ring-like reinforcing section such that a portion of the holding tape is a spaced distance from an inside side surface of the ring-like reinforcing section; and heating the holding tape to at least 0.6 times of melting temperature of the holding tape so as to decrease the spaced distance.

7. The method of claim 6, wherein heating the holding tape to at least 0.6 times of melting temperature of the holding tape adheres the holding tape to the inside side surface of the ring-like reinforcing section.

8. The method according to claim 6, wherein the holding tape is heated by lamp heating.

9. The method according to claim 8, wherein an electrode is provided on the rear surface of the wafer.

10. The method according to claim 6, wherein the holding tape is adhered on the rear surface by differential pressure across the holding tape of an atmosphere and a vacuum of 1000 Pa or below.

11. The method according to claim 10, wherein the holding tape is heated by lamp heating while the differential pressure is applied to the holding tape.

\* \* \* \* \*